United States Patent
Broughton

(10) Patent No.: US 7,193,450 B1
(45) Date of Patent: Mar. 20, 2007

(54) LOAD SENSING BUFFER CIRCUIT WITH CONTROLLED SWITCHING CURRENT NOISE (DI/DT)

(75) Inventor: David L. Broughton, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 74 days.

(21) Appl. No.: 11/003,779

(22) Filed: Dec. 2, 2004

(51) Int. Cl.
*H03K 3/00* (2006.01)

(52) U.S. Cl. .......................... 327/108; 326/82; 326/83
(58) Field of Classification Search ................. 327/108
See application file for complete search history.

(56) References Cited

U.S. PATENT DOCUMENTS

| | | | |
|---|---|---|---|
| 4,779,013 A | 10/1988 | Tanaka | 326/27 |
| 4,961,010 A | 10/1990 | Davis | 326/27 |
| 5,036,222 A | 7/1991 | Davis | 326/27 |
| 5,081,374 A | 1/1992 | Davis | 326/27 |
| 5,121,013 A * | 6/1992 | Chuang et al. | 326/26 |
| 5,864,244 A * | 1/1999 | Kaplinsky | 326/58 |
| 6,272,577 B1 * | 8/2001 | Leung et al. | 710/110 |
| 6,281,706 B1 | 8/2001 | Wert et al. | 326/83 |
| 6,760,209 B1 * | 7/2004 | Sharpe-Geisler | 361/111 |
| 6,870,391 B1 * | 3/2005 | Sharpe-Geisler | 326/37 |

* cited by examiner

*Primary Examiner*—Timothy P. Callahan
*Assistant Examiner*—Hiep Nguyen
(74) *Attorney, Agent, or Firm*—Vedder, Price, Kaufman & Kammholz, P.C.

(57) ABSTRACT

A load sensing buffer circuit for providing a buffered clock signal with controlled switching current noise (di/dt) in which the input clock signal is selectively gated to provide successively generated source and sink current components as part of the buffered output signal, with the timing of such current components being dependent upon load capacitance.

18 Claims, 8 Drawing Sheets

LOAD SENSING BUFFER CIRCUIT WITH CONTROLLED SWITCHING CURRENT NOISE (DI/DT)

BACKGROUND OF THE INVENTION

1. Field of Invention

The present invention relates to buffer circuits for digital systems, and in particular, to buffer circuits having controlled output signal switching characteristics.

2. Description of the Related Art

In many digital circuits, even within individual digital integrated circuits, it is often necessary to distribute certain signals, such as a clock signal, to many different circuits. As a result, the effective load capacitance seen by the circuit responsible for distributing the signal can become relatively high. This can often result in significant current to drive this load along with significant switching current noise (di/dt), particularly at the high signal frequencies typical to many digital circuits. Such switching current noise di/dt produces undesirable voltage spikes in circuit inductances such as integrated circuit traces and bond wires.

Accordingly, it would be desirable to have a buffer circuit for providing a buffered digital signal, such as a clock signal, in such a manner as to compensate for increased load capacitance so that the switching current noise is minimized.

SUMMARY OF THE INVENTION

In accordance with the presently claimed invention, a load sensing buffer circuit provides a buffered clock signal with controlled switching current noise (di/dt) in which the input clock signal is selectively gated to provide successively generated source and sink current components as part of the buffered output signal, with the timing of such current components being dependent upon load capacitance.

In accordance with one embodiment of the presently claimed invention, a load sensing buffer circuit for providing a buffered clock signal with controlled switching current noise (di/dt), includes input and output electrodes, and buffer amplifier circuitry. The input electrode is to convey an input clock signal. The output electrode is to convey, to a load capacitance, a buffered clock signal corresponding to the input clock signal. The buffer amplifier circuitry is coupled between the input and output electrodes, and includes input amplifier circuitry and output amplifier circuitry. The input amplifier circuitry is coupled to the input and output electrodes, and responsive to the input clock signal by providing first and second components of the buffered clock signal and a first intermediate signal corresponding to the input clock signal. The output amplifier circuitry is coupled to the input electrode, the output electrode and the input amplifier circuitry, and responsive to the input clock signal and the first intermediate signal by providing at least a third component of the buffered clock signal and at least a second intermediate signal corresponding to the input clock signal.

In accordance with another embodiment of the presently claimed invention, a load sensing buffer circuit for providing a buffered clock signal with controlled switching current noise (di/dt), includes input means, output means, input amplifier means and output amplifier means. The input means is for conveying an input clock signal. The output means is for conveying, to a load capacitance, a buffered clock signal corresponding to the input clock signal. The input amplifier means is for receiving the input clock signal and in response thereto providing first and second components of the buffered clock signal and a first intermediate signal corresponding to the input clock signal. The output amplifier means is for receiving the input clock signal and the first intermediate signal and in response thereto providing at least a third component of the buffered clock signal and at least a second intermediate signal corresponding to the input clock signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

As discussed in more detail below, a load sensing buffer circuit for providing a buffered clock signal with controlled switching current noise in accordance with one embodiment of the presently claimed invention provides a digital output signal with a slew rate that is dependent upon load capacitance. In other words, the output signal voltage transitions with a drive current that increases with time. The circuitry senses how slow the output signal is switching state and modifies the amount of drive current to the load accordingly. For example, for a larger, i.e. more capacitive load, the output transitions more slowly and more current is provided to drive the load.

Figure 1A:
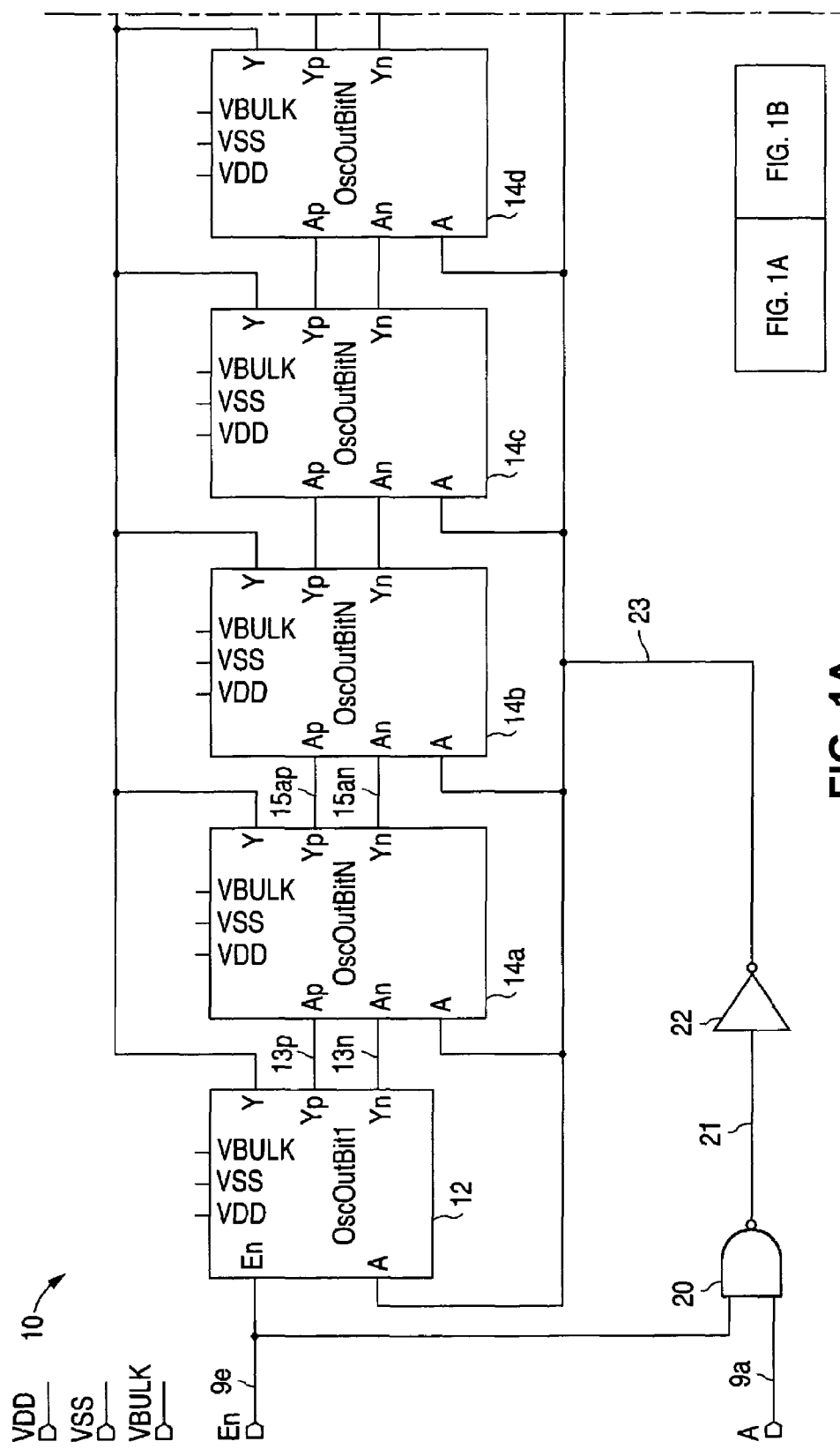
FIG. 1 is a block diagram of a buffer circuit in accordance with one embodiment of the presently claimed invention.
Figure 1B:
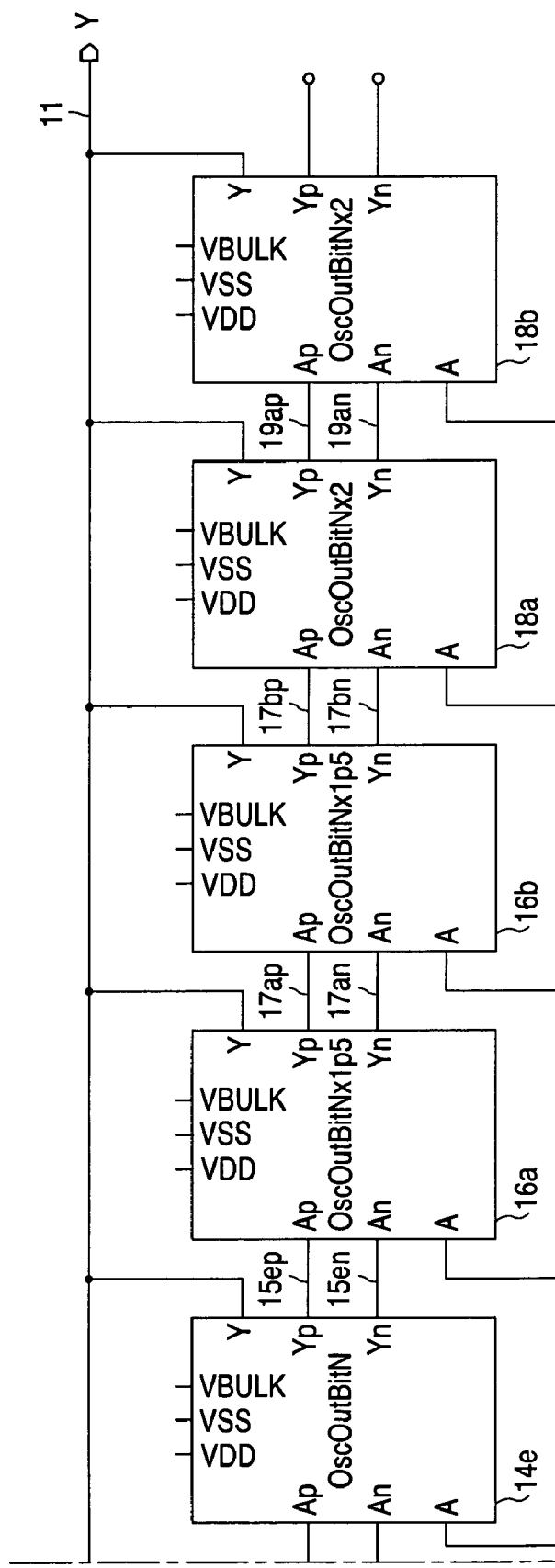

Referring to FIG. 1, a buffer circuit 10 in accordance with one embodiment of the presently claimed invention includes multiple stages for buffering an input signal 23 to produce the output signal 11. In this particular embodiment, 10 stages are used. An input clock signal 9a is gated by an enablement signal 9e through a logic NAND gate 20 and inverter 22 to become the input clock signal 23 which is buffered to produce the buffered output signal 11. Each of the 10 circuit stages 12, 14, 16, 18 receives the input signal 23 and provides a respective signal component to the final output signal 11. As discussed in more detail below, these respective signal components are in the form of currents being either sourced to or sunk from the output electrode via which the output signal 11 is conveyed.

The first stage 12 drives the output signal 11 electrode with a signal pulse having a width determined by the capacitance of the load circuit (not shown) and has the first set of output signal drivers (discussed in more detail below). This stage 12 also produces intermediate signals 13p, 13n having opposing, or mutually inverse, signal phases, or polarities, which serve as additional input signals to the second stage 14a. Similarly, the second stage 14a responds to the input clock signal 23 and the intermediate signals 13p, 13n from the prior stage 12 to produce an additional signal component (a sourcing or sinking current as appropriate) for the output signal 11. Further, similarly, the second stage 14a generates additional intermediate signals 15ap, 15an, for the third stage 14b. These intermediate signals 15ap, 15an correspond to but are delayed with respect to the input intermediate signals 13p, 13n for this stage 14a. As a result, each stage 12, 14, 16, 18 acts in part as an element in a delay line which passes a pulse downstream, with the final pulse width determined by the output load.

This response to the input clock signal 23 and input intermediate signals to provide output signal components and further intermediate signals continues with each successive stage, with each stage introducing its own respective time delay for its output signal components and output intermediate signals. Additionally, all such signal delays are gated by the input clock signal 23 to ensure that the current states of the output signal components and intermediate signals terminate completely before the next input signal state change is initiated. Additionally, by using progressively larger output transistors, the seventh and eighth stages, 16a, 16b provide more drive current than the preceding stages 12, 14, while the last two stages 18a, 18b provide still greater current drive than their preceding stages 16a, 16b. This advantageously compensates for the decreased output signal drive that would otherwise occur as the output signal approaches its peak value.

Figure 2A:
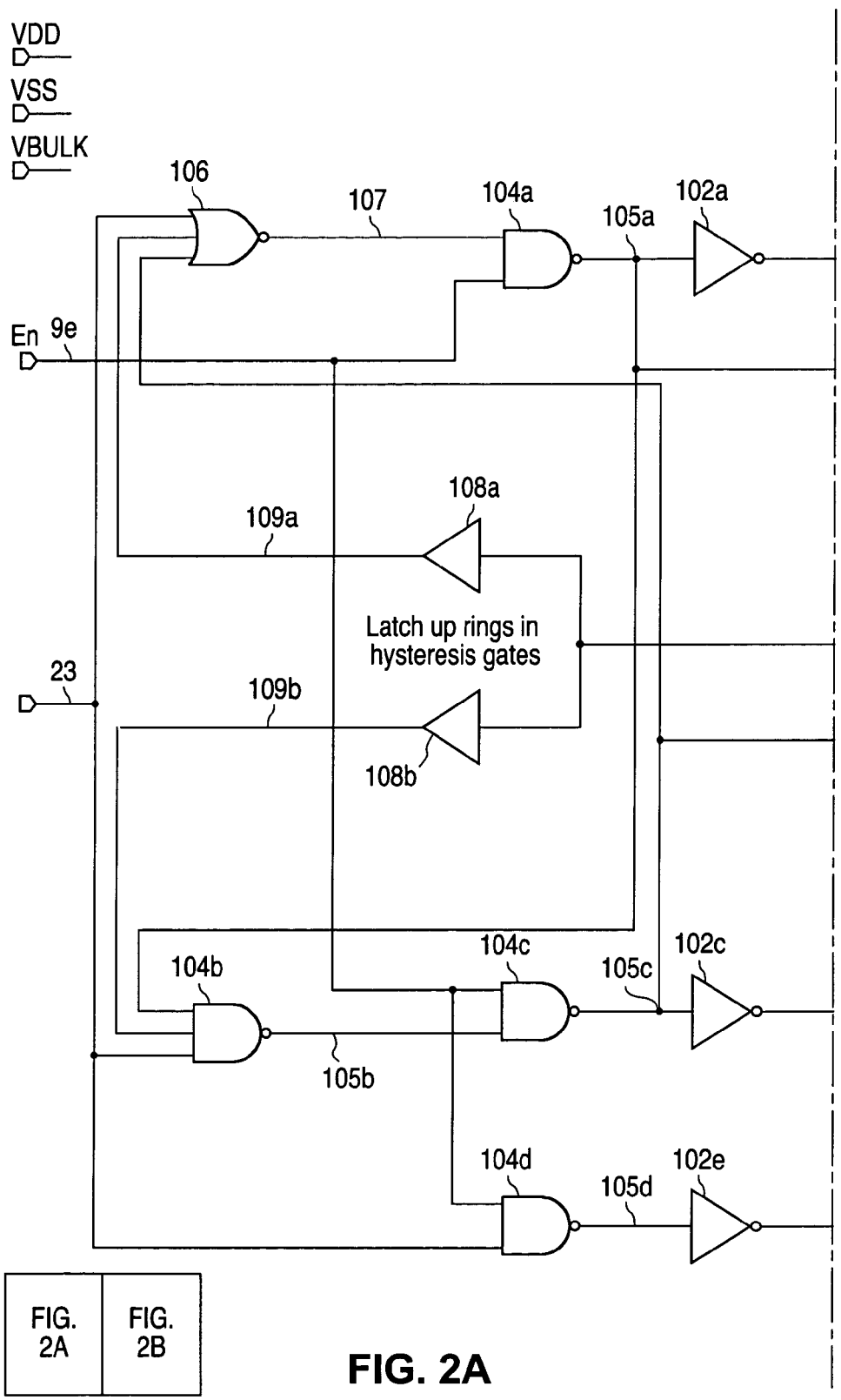
FIG. 2 is a schematic diagram of the first stage of the circuit of FIG. 1.
Figure 2B:
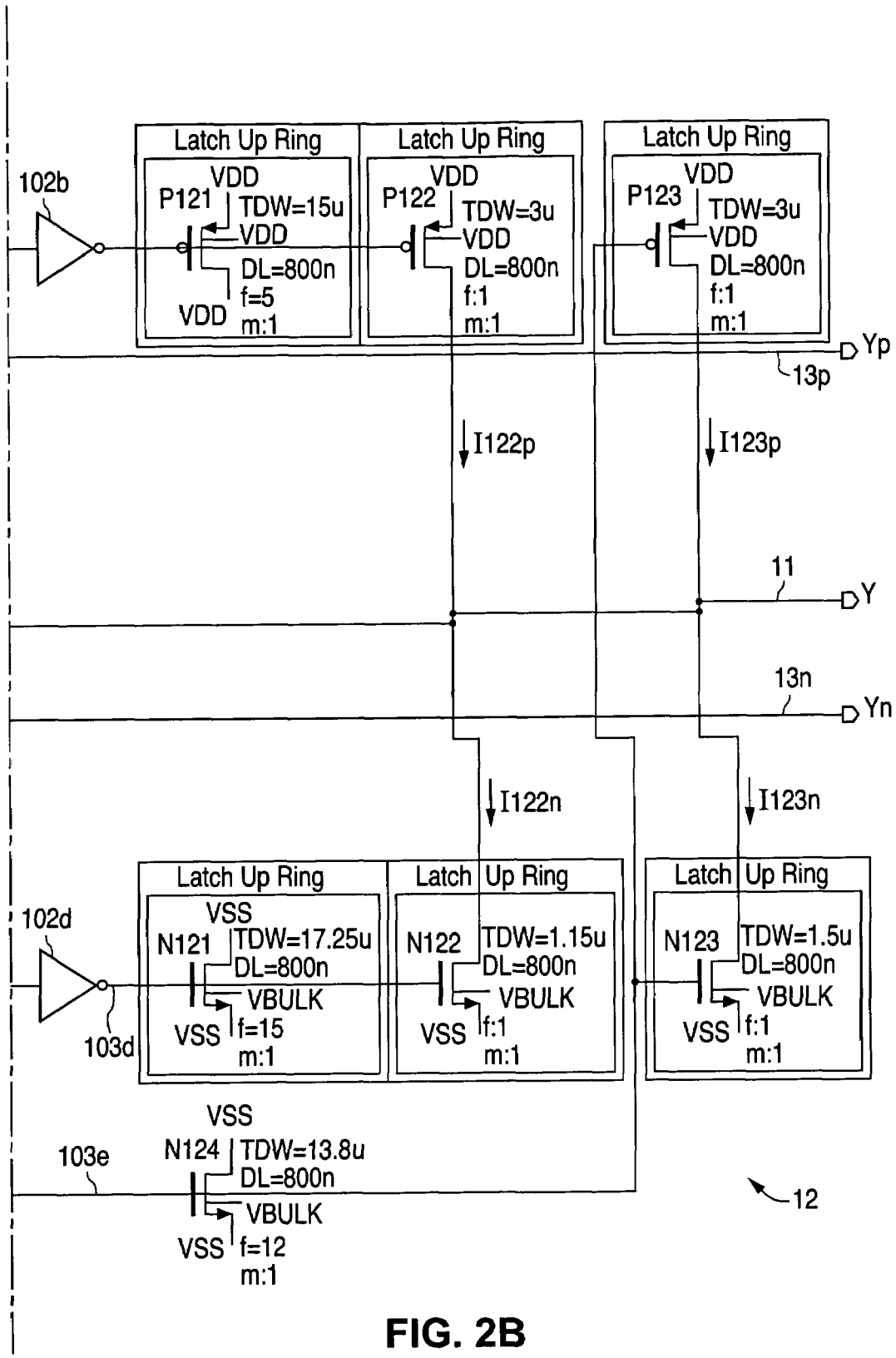

Referring to FIG. 2, the first stage 12 includes logic inverters 102, logic NAND gates 104, a logic NOR gate 106, buffer amplifier circuits 108, current source circuits in the form of p-type metal oxide semiconductor field effect transistors (P-MOSFETs) P122, P123, current sink circuits in the form of N-MOSFETs N122, N123 and capacitances implemented as capacitor-connected P-MOSFET P121 and N-MOSFET 124, all interconnected substantially as shown. The enablement signal 9e is used merely to enable operation of this circuit 12 when high and disable operation of the circuit 12 when low. The following discussion of the various circuit stages presumes that the enable input signal 9e is at a logic high state.

When the input clock signal 23 goes high, the output 105d of NAND gate 104d goes low, thereby causing the output 103e of inverter 102e to go high. As a result, this high signal 103e, which rises more slowly than it might otherwise due to the capacitance on the line provided by transistor N124 connected as a capacitor, causes transistor P123 to turn off and transistor N123 to turn, thereby pulling the output signal 11 low by virtue of the current I123n sunk by transistor N123 from the output electrode.

Additionally, the output 105b on NAND gate 104b goes low, thereby causing the output 105c of NAND gate 104c and the output 103d of inverter 102d to go high. This high signal 103e, which also rises more slowly than it might otherwise due to the capacitance introduced by transistor N121 connected as a capacitor, causes transistor N122 to turn on, which sinks an additional current I122n from the output electrode. As the voltage value of the output signal 11 transitions toward its low value state due to the actions of transistors N122 and N123, it will transcend the threshold voltage associated with feedback amplifier 108b. When this threshold has been crossed, the output signal 109b effectively disables the inputs of NAND gate 104b, thereby causing transistor N122 to turn off. As a result, its pull-down current I122n is terminated.

Conversely, when the input clock signal 23 goes low, the current sourcing transistor P123 turns on and current sinking transistor N123 turns off. This causes a pull-up current I23P to be applied as an output signal 11 component. Additionally, the output 107 of NOR gate 106 goes high and the output 105a of NAND gate 104a goes low, thereby causing transistor P122 to turn on and provide additional pull-up current I122p as another output signal 11 component. As the voltage value of the output signal 11 transitions toward its high state, it will transcend the input threshold voltage of feedback amplifier 108a. This causes its output signal 109a to go high, thereby disabling propagation of the input clock signal 23 through NOR gate 106. As a result, transistor P122 is turned off, thereby terminating its sourcing of pull-up current I122p.

Under both of these circumstances, i.e., when the input clock signal 23 remains at its high and low states, transistor P123 or transistor N123 remains on to hold the output signal 11 at its high or low voltage value, respectively, notwithstanding termination of the pull-up I122p and pull-down I122n currents as discussed above. In accordance with a preferred embodiment of the presently claimed invention, these output driver transistors P122, P123, N122, N123 have gate electrodes which are longer than the minimum values (e.g., 0.8 microns) to help minimize initial turn-on current spikes.

Figure 3:
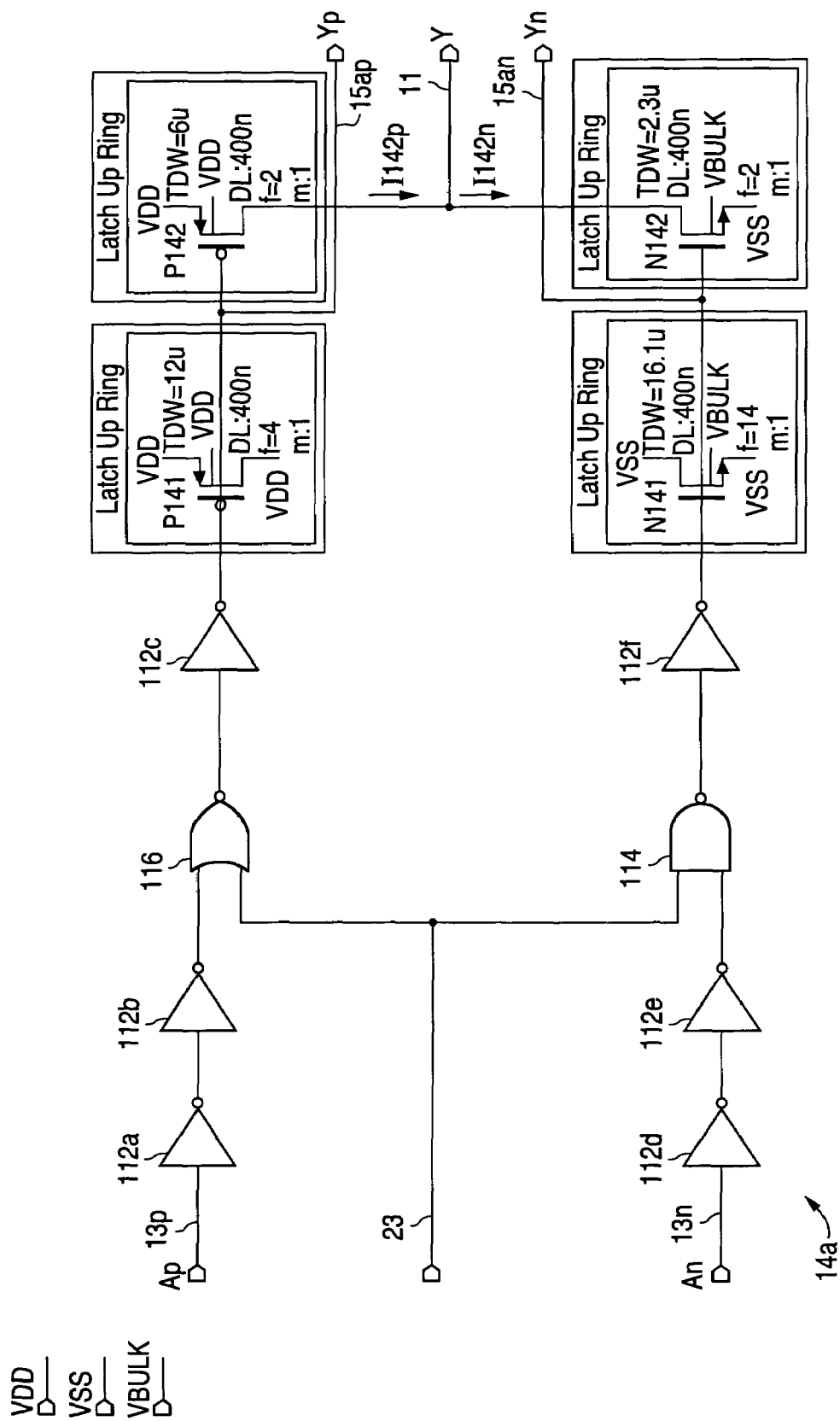
FIG. 3 is a schematic diagram of the second, third, fourth, fifth and sixth stages of the circuit of FIG. 1.

Referring to FIG. 3, the second, third, fourth, fifth and sixth successive stages are substantially identical, with the first 14a of the stages depicted here. This stage 14a includes inverters 112, a NAND gate 114, a NOR gate 116, capacitor-connected transistors P141, N141, a pull-up transistor P142 and a pull-down transistor N142, all interconnected substantially as shown. The incoming intermediate signals 13p, 13n (discussed in more detail above) are effectively gated by the input clock signal 23 in NOR gate 116 and NAND gate 114. The input inverters 112a, 112b, 112d, 112e, delay their respective incoming intermediate signal 13p, 13n, thereby delaying the application of pull-up current I142p and pull-down current I142n as output signal 11 components. The NOR gate 116 and NAND gate 114 allow the input clock signal 123 to terminate the propagation of the incoming signals 13p, 13n in the event that the input clock signal 23 changes state before these incoming signals 13p, 13n have propagated through all stages 14. The inverters 112, NAND gate 114 and NOR gate 116 also delay application of the intermediate output signals 115ap, 115an to the next stage.

Figure 4:
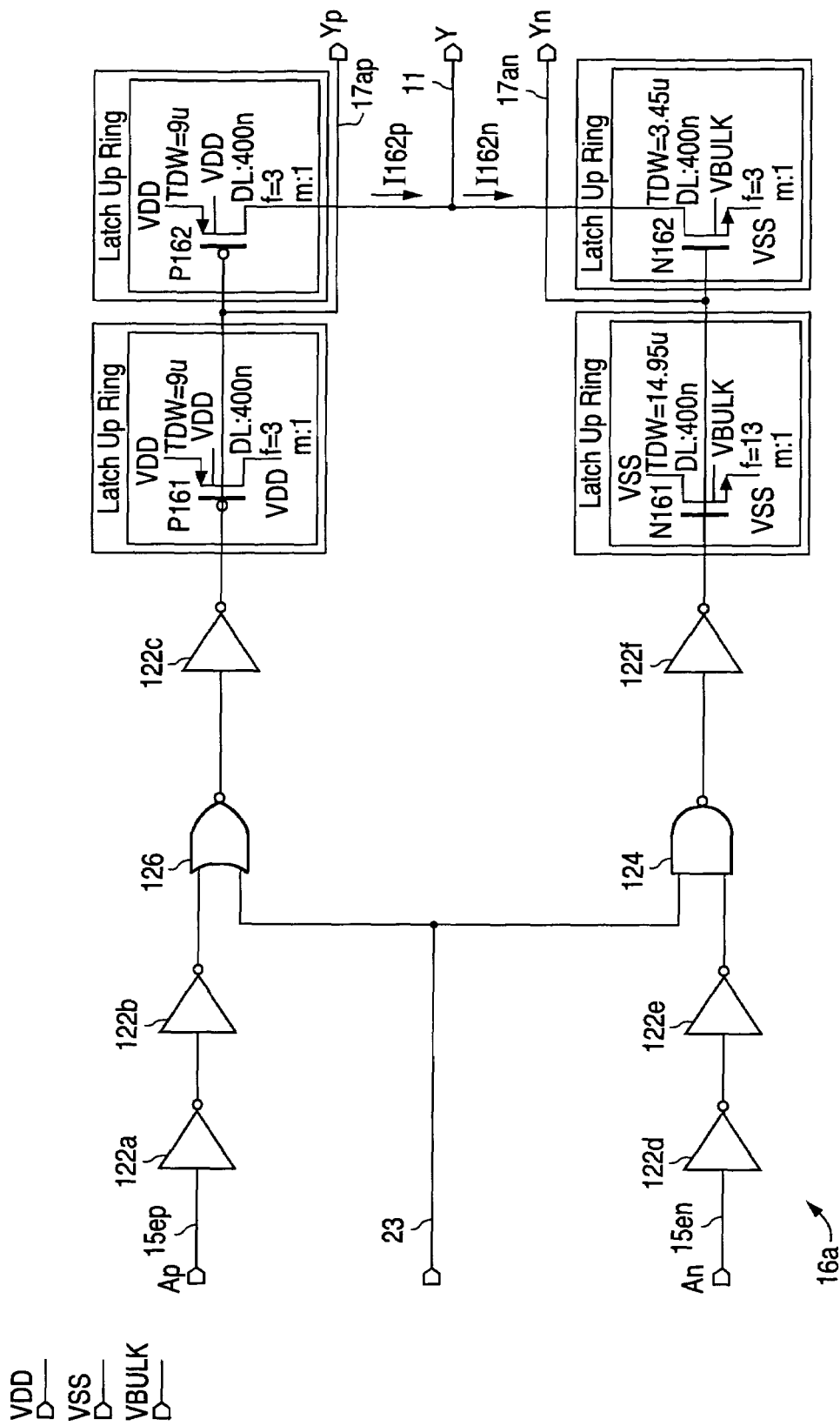
FIG. 4 is a schematic diagram of the seventh and eighth stages of the circuit of FIG. 1.

Referring to FIG. 4, the next two stages 16a, 16b, with the first stage 16a depicted here, include inverters 122, a NAND gate 124, a NOR gate 126, capacitor-connected transistors P161, N161, a pull-up transistor P162 and pull-down transistor N162, all interconnected substantially as shown. As can be seen, this circuitry 16a is substantially similar to the circuitry 14a of the preceding stages, and operates in conformance with the discussion above.

Figure 5:
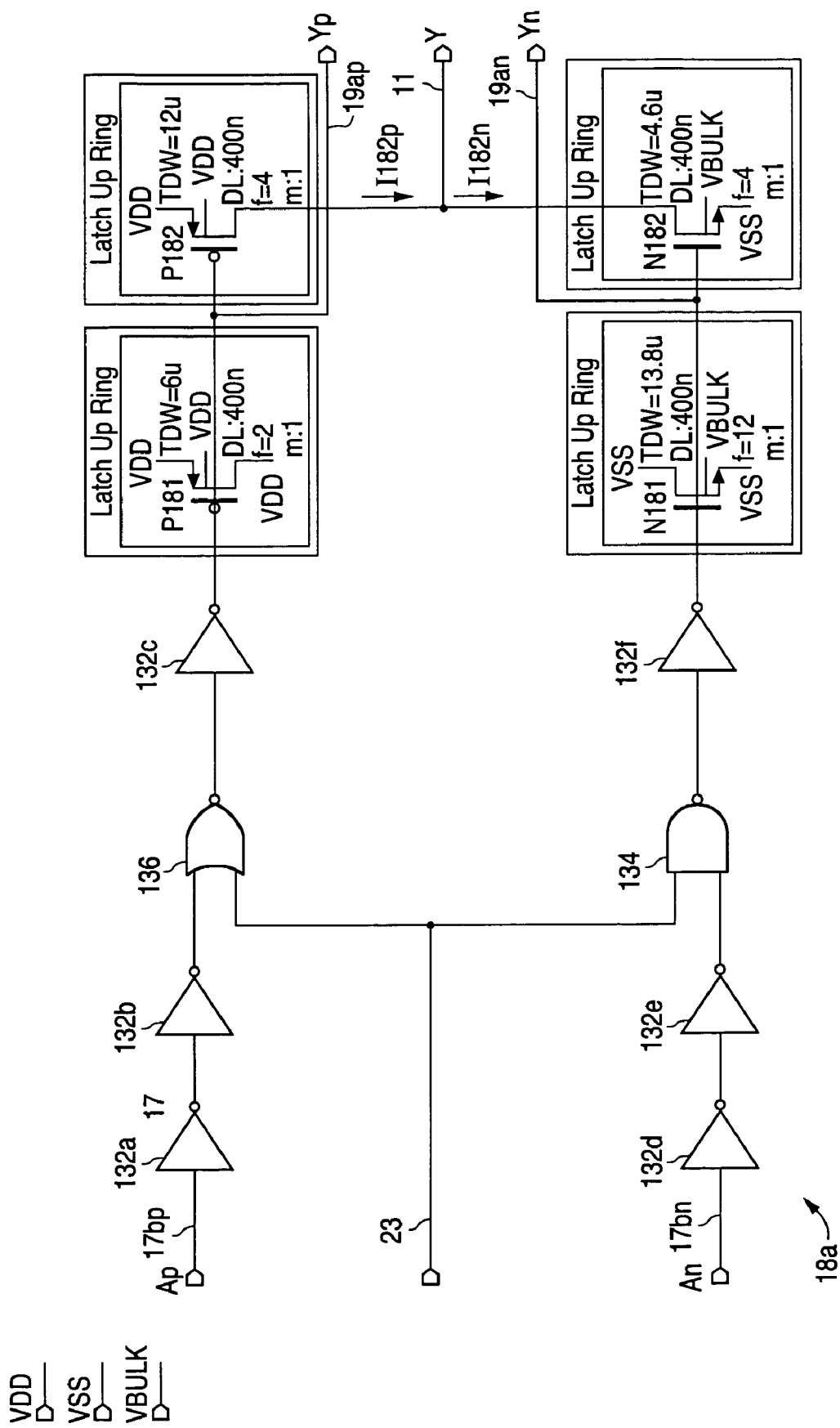
FIG. 5 is a schematic diagram of the ninth and tenth stages of the circuit of FIG. 1.

Referring to FIG. 5, the last two stages 18a, 18b, with the first stage 18a depicted here, include inverters 132, a NAND gate 134, a NOR gate 136, capacitor-connected transistors P181, N181, a pull-up transistor P182 and pull-down transistor N182, all interconnected substantially as shown. As can be seen, this circuitry 18a is substantially similar to the circuitry 14a of the preceding stages, and operates in conformance with the discussion above.

In accordance with a preferred embodiment of the presently claimed invention, improvements, i.e. reductions in switching current noise di/dt by a factor in the range of two to three times can be realized. For example, in accordance with one embodiment of the presently claimed invention, under typical, best and worst case conditions, spikes in the power supply (VDD and VSS) currents were simulated at 11, 20 and 4.5 milliamperes (mA), respectively as compared to 7.3, 14.5 and 3.0 mA, respectively, for a conventional buffer circuit design. The corresponding switching current noise values were 8.5, 20 and 2.9 milliamperes per second (mA/s) for the buffer circuit in accordance with one embodiment of the presently claimed invention, versus 24, 64 and 6.2 mA/s, respectively, for the conventional buffer circuit design.

Pertinent transistor parameters used for producing these results are as follows. For the first stage 12 (FIG. 2), the pull-up transistors P122, P123 had transistor channel widths of 3 micrometers and channel lengths of 800 nanometers, while the pull-down transistors N122, N123 had channel widths of 1.15 micrometers and channel lengths of 800 nanometers. For the second, third, fourth, fifth and sixth stages 14 (FIG. 3), the pull-up transistor P142 had a channel width of 6 micrometers and a channel length of 400 nanometers, while the pull-down transistor N142 had a channel width of 2.3 micrometers and a channel length of 400 nanometers. For the seventh and eighth stages 16 (FIG. 4), the pull-up transistor P162 had a channel width of 9 micrometers and a channel length of 400 nanometers, while the pull-down transistor N162 had a channel width of 3.45 micrometers and a channel length of 400 nanometers. For the ninth and tenth stages 18 (FIG. 5), the pull-up transistor P182 had a channel width of 12 micrometers and a channel length of 400 nanometers, while the pull-down transistor N182 had a channel width of 4.6 micrometers and a channel length of 400 nanometers.

Figure 6A:
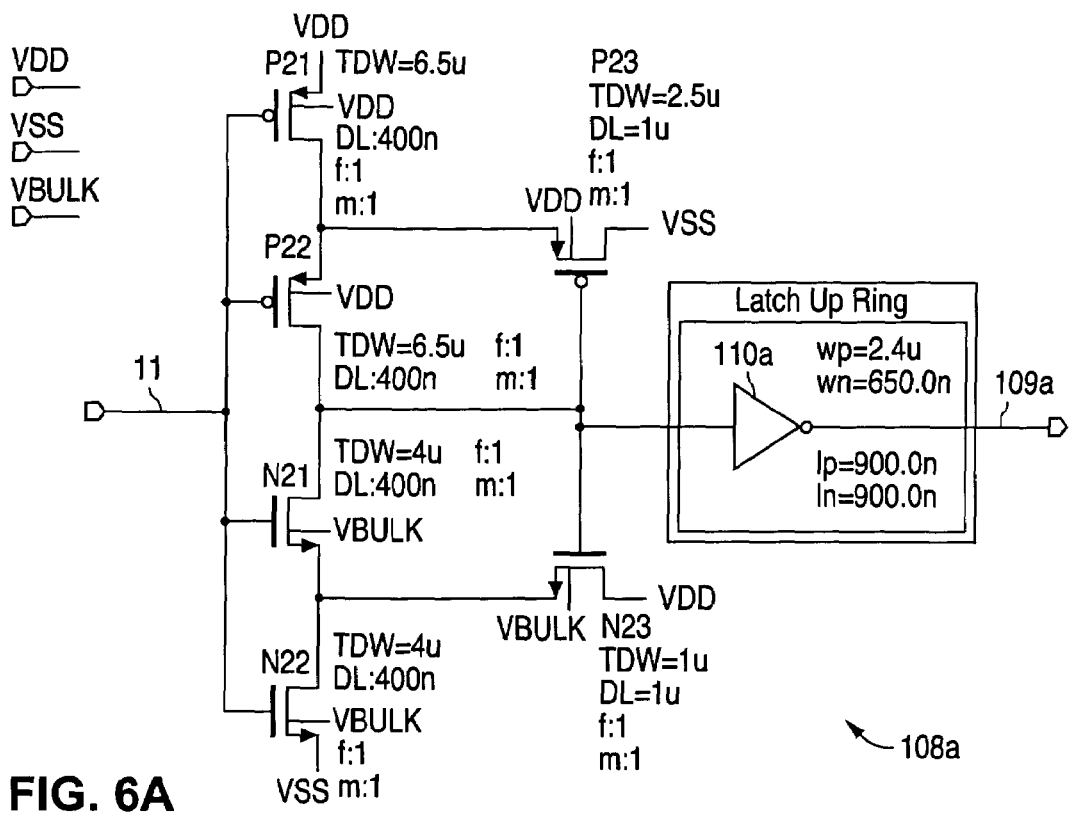
FIGS. 6A and 6B are schematic diagrams of the feedback buffer circuits of the circuit of FIG. 2.

Referring to FIG. 6A, the first 108a of the two feedback amplifier circuits of the circuit of FIG. 2 includes P-MOSFETs P21, P22 and P23, N-MOSFETs N21, N22 and N23, and inverter 110a, all interconnected substantially as shown. As discussed above, this circuit 108a has a threshold voltage which determines when its output signal 109a changes its state as the input signal 11 transitions between its minimum and maximum values. Such threshold voltage is determined in accordance with well-known principles by the widths (in micrometers) and lengths (in nanometers) of the channels for the respective transistors, which are as follow for a preferred embodiment of the presently claimed invention: 6.5 and 400 for transistors P21 and P22; 2.5 and 1 for transistor P23; 4 and 400 for transistors N21 and N22; and 1 and 1 for transistor N23.

Figure 6B:
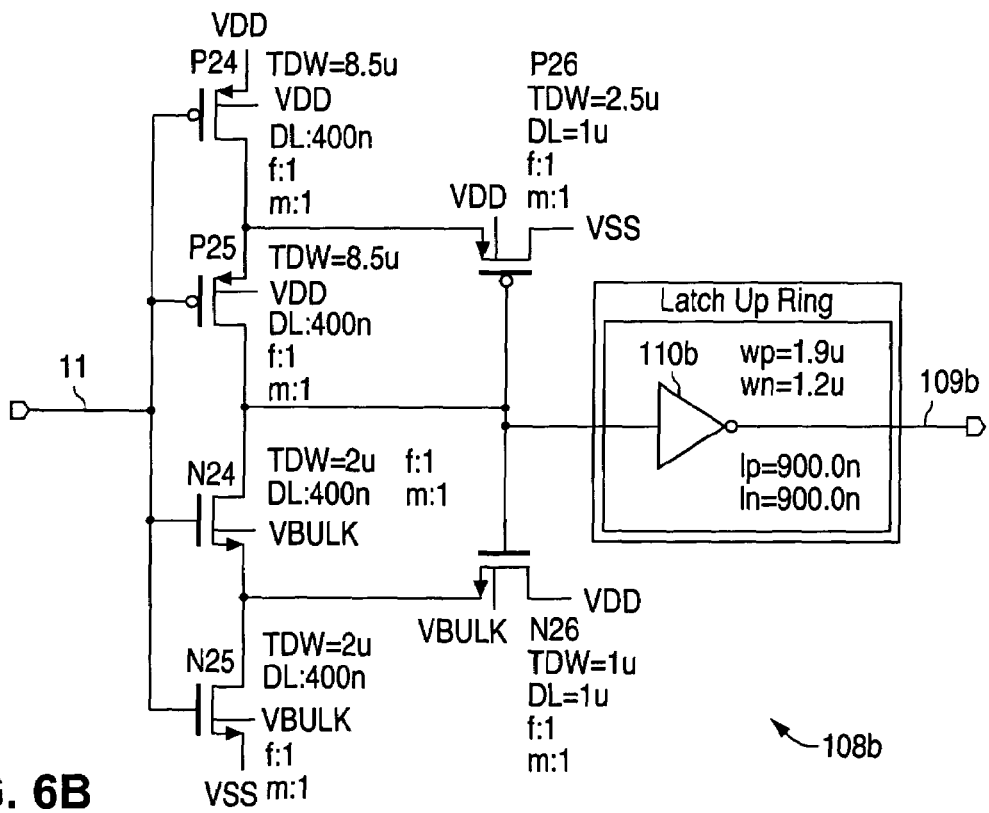

Referring to FIG. 6B, the second 108b of the two feedback amplifier circuits of the circuit of FIG. 2 includes P-MOSFETs P24, P25 and P26, N-MOSFETs N24, N25 and N26, and inverter 110b, all interconnected substantially as shown. As discussed above, this circuit 108b has a threshold voltage which determines when its output signal 109b changes its state as the input signal 11 transitions between its minimum and maximum values. Such threshold voltage is determined in accordance with well-known principles by the widths (in micrometers) and lengths (in nanometers) of the channels for the respective transistors, which are as follow for a preferred embodiment of the presently claimed invention: 8.5 and 400 for transistors P24 and P25; 2.5 and 1 for transistor P26; 2 and 400 for transistors N24 and N25; and 1 and 1 for transistor N26.

In other words, each of the feedback amplifier circuits 108a, 108b acts as a hysteresis gate by preventing glitches in the output signal which might otherwise occur due to inadvertent activations or terminations of the operations of the delay line elements. As a result, these feedback amplifier circuits 108a, 108b effectively determine the pulse widths of the pull-up and pull-down currents. The slower the rise or fall time of the output signal 11 is, the longer it takes to transition through the feedback amplifier circuit threshold voltage and the longer the output signal 11 remains active or on. This allows more current (i.e., charge) to be delivered to the output for charging the load capacitance, thereby improving (i.e., decreasing) the signal propagation delay.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a load sensing buffer circuit for providing a buffered clock signal with controlled switching current noise (di/dt), comprising:
    an input electrode to convey an input clock signal;
    an output electrode to convey, to a load capacitance, a buffered clock signal corresponding to said input clock signal; and
    buffer amplifier circuitry coupled between said input and output electrodes, and including
        input amplifier circuitry coupled to said input and output electrodes, and responsive to said input clock signal by providing first and second components of said buffered clock signal and a first intermediate signal corresponding to said input clock signal, and
        output amplifier circuitry coupled to said input electrode, said output electrode and said input amplifier circuitry, and responsive to said input clock signal and said first intermediate signal by providing at least a third component of said buffered clock signal and at least a second intermediate signal corresponding to said input clock signal.

2. The apparatus of claim 1, wherein:
    said buffered clock signal comprises a sum of at least first, second and third signal currents; and
    said first, second and third components of said buffered clock signal comprise said first, second and third signal currents, respectively.

3. The apparatus of claim 1, wherein:
    said buffered clock signal comprises a voltage signal having minimum and maximum values; and
    said input amplifier circuitry is further responsive to said buffered clock signal, following a transition of said voltage signal between said minimum and maximum values, by disabling said first component of said buffered clock signal.

4. The apparatus of claim 3, wherein said input amplifier circuitry comprises logic circuitry coupled to said input and output electrodes, and responsive to said buffered clock signal by selectively gating said input clock signal.

5. The apparatus of claim 3, wherein said input amplifier circuitry comprises feedback circuitry coupled to said output electrode, having first and second voltage thresholds between said minimum and maximum voltage signal values, and responsive to said buffered clock signal, following a transcension by said voltage signal of at least one of said first and second voltage thresholds, by disabling said first component of said buffered clock signal.

6. The apparatus of claim 1, wherein:
said buffered clock signal comprises a voltage signal having minimum and maximum values; and
said input amplifier circuitry is further responsive to said buffered clock signal, following a transition of said voltage signal between said minimum and maximum values, by inverting said first intermediate signal.

7. The apparatus of claim 6, wherein said input amplifier circuitry comprises logic circuitry coupled to said input and output electrodes, and responsive to said buffered clock signal by selectively gating said input clock signal.

8. The apparatus of claim 6, wherein said input amplifier circuitry comprises feedback circuitry coupled to said output electrode, having first and second voltage thresholds between said minimum and maximum voltage signal values, and responsive to said buffered clock signal, following a transcension by said voltage signal of at least one of said first and second voltage thresholds, by inverting said first intermediate signal.

9. The apparatus of claim 1, wherein:
said buffered clock signal comprises a voltage signal having minimum and maximum values; and
said input amplifier circuitry is further responsive to said buffered clock signal, following a transition of said voltage signal between said minimum and maximum values, by disabling said first component of said buffered clock signal and inverting said first intermediate signal.

10. The apparatus of claim 9, wherein said input amplifier circuitry comprises logic circuitry coupled to said input and output electrodes, and responsive to said buffered clock signal by selectively gating said input clock signal.

11. The apparatus of claim 9, wherein said input amplifier circuitry comprises feedback circuitry coupled to said output electrode, having first and second voltage thresholds between said minimum and maximum voltage signal values, and responsive to said buffered clock signal, following a transcension by said voltage signal of at least one of said first and second voltage thresholds, by disabling said first component of said buffered clock signal and inverting said first intermediate signal.

12. The apparatus of claim 1, wherein said input amplifier circuitry comprises:
current source circuitry coupled to said output electrode; and
current sink circuitry coupled to said output electrode.

13. The apparatus of claim 1, wherein said input amplifier circuitry comprises:
pull-up amplifier circuitry coupled to said output electrode; and
pull-down amplifier circuitry coupled to said output electrode.

14. The apparatus of claim 1, wherein said output amplifier circuitry comprises:
first amplifier circuitry coupled to said input electrode, said output electrode and said input amplifier circuitry, and responsive to said input clock signal and said first intermediate signal by providing said third component of said buffered clock signal and said second intermediate signal; and
second amplifier circuitry coupled to said input electrode, said output electrode and said first amplifier circuitry, and responsive to said input clock signal and said second intermediate signal by providing at least a fourth component of said buffered clock signal.

15. The apparatus of claim 14, wherein:
said buffered clock signal comprises a sum of at least first, second, third and fourth signal currents; and
said first, second, third and fourth components of said buffered clock signal comprise said first, second, third and fourth signal currents, respectively.

16. The apparatus of claim 1, wherein said output amplifier circuitry comprises:
current source circuitry coupled to said output electrode; and
current sink circuitry coupled to said output electrode.

17. The apparatus of claim 1, wherein said output amplifier circuitry comprises:
pull-up amplifier circuitry coupled to said output electrode; and
pull-down amplifier circuitry coupled to said output electrode.

18. An apparatus including a load sensing buffer circuit for providing a buffered clock signal with controlled switching current noise (di/dt), comprising:
input means for conveying an input clock signal;
output means for conveying, to a load capacitance, a buffered clock signal corresponding to said input clock signal;
input amplifier means for receiving said input clock signal and in response thereto providing first and second components of said buffered clock signal and a first intermediate signal corresponding to said input clock signal; and
output amplifier means for receiving said input clock signal and said first intermediate signal and in response thereto providing at least a third component of said buffered clock signal and at least a second intermediate signal corresponding to said input clock signal.

* * * * *